US009780265B2

(12) United States Patent
Herrmann et al.

(10) Patent No.: US 9,780,265 B2
(45) Date of Patent: Oct. 3, 2017

(54) OPTOELECTRONIC SEMICONDUCTOR COMPONENT

(71) Applicant: OSRAM Opto Semiconductors GmbH, Regensburg (DE)

(72) Inventors: Siegfried Herrmann, Neukirchen (DE); Juergen Moosburger, Lappersdorf (DE); Stefan Illek, Donaustauf (DE); Frank Singer, Regenstauf (DE); Norwin Von Malm, Nittendorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/117,177

(22) PCT Filed: Jan. 21, 2015

(86) PCT No.: PCT/EP2015/051148
§ 371 (c)(1),
(2) Date: Aug. 5, 2016

(87) PCT Pub. No.: WO2015/117824
PCT Pub. Date: Aug. 13, 2015

(65) Prior Publication Data
US 2016/0351758 A1    Dec. 1, 2016

(30) Foreign Application Priority Data
Feb. 6, 2014  (DE) .................. 10 2014 101 492

(51) Int. Cl.
*H01L 33/00* (2010.01)
*H01L 33/50* (2010.01)
(Continued)

(52) U.S. Cl.
CPC ........ *H01L 33/505* (2013.01); *H01L 33/0095* (2013.01); *H01L 33/405* (2013.01);
(Continued)

(58) Field of Classification Search
CPC . H01L 33/505; H01L 33/0095; H01L 33/405; H01L 33/486; H01L 33/60;
(Continued)

(56) References Cited

U.S. PATENT DOCUMENTS

2012/0241793 A1   9/2012  In et al.
2015/0207046 A1*  7/2015  Ikegami ............... H01L 33/508
                                                          257/98
2016/0240735 A1*  8/2016  Moran .................... H01L 33/20

FOREIGN PATENT DOCUMENTS

DE    102005007601 A1   9/2005
DE    102008010512 A1   8/2009
(Continued)

*Primary Examiner* — Tu-Tu Ho
(74) *Attorney, Agent, or Firm* — McDermott Will & Emery LLP

(57) ABSTRACT

The invention relates to an optoelectronic semiconductor component (1) comprising:—an optoelectronic semiconductor chip (2), comprising—a growth substrate (21) having a growth surface (21a),—a layer sequence (22) with a semiconductor layer sequence (221, 222, 223) with an active zone (222) grown on the growth surface (21a),—contact points (29) for electrically contacting the semiconductor layer sequence (221, 222, 223) and—and insulation layer (26), which is formed in an electrically insulating manner—a connection carrier (4), which is mounted to the cover surface (2a) of the optoelectronic semiconductor chip facing away from the growth surface (21a), wherein—the semiconductor layer sequence (221, 222, 223) is connected to the connection carrier (4) in an electrically conducting manner and—a conversion layer (5) is applied to a bottom surface (21c) of the growth substrate (21) facing away from the growth surface (21a) and to all side surfaces (21b) of the growth substrate (21).

18 Claims, 3 Drawing Sheets

(51) Int. Cl.
*H01L 33/48* (2010.01)
*H01L 33/60* (2010.01)
*H01L 33/62* (2010.01)
*H01L 33/40* (2010.01)
H01L 25/075 (2006.01)
H01L 33/10 (2010.01)
H01L 33/46 (2010.01)

(52) U.S. Cl.
CPC ............ *H01L 33/486* (2013.01); *H01L 33/60* (2013.01); *H01L 33/62* (2013.01); *H01L 25/0753* (2013.01); *H01L 33/0079* (2013.01); *H01L 33/10* (2013.01); *H01L 33/46* (2013.01); *H01L 2924/0002* (2013.01); *H01L 2933/0041* (2013.01); *H01L 2933/0066* (2013.01)

(58) Field of Classification Search
CPC ..... H01L 33/62; H01L 33/0079; H01L 33/10; H01L 33/46; H01L 2924/0002; H01L 2933/0041; H01L 2933/0066; H01L 25/0753

USPC .......................................................... 257/98
See application file for complete search history.

(56) References Cited

FOREIGN PATENT DOCUMENTS

| | | |
|---|---|---|
| DE | 102009022966 A1 | 12/2010 |
| DE | 102009032486 A1 | 1/2011 |
| DE | 102009051746 A1 | 3/2011 |
| DE | 102010025320 A1 | 12/2011 |
| DE | 102011011378 A1 | 8/2012 |
| DE | 102011015821 A1 | 10/2012 |
| EP | 2503606 A2 | 9/2012 |
| WO | 2011039023 A1 | 4/2011 |
| WO | 2012152307 A1 | 11/2012 |
| WO | 2014006539 A1 | 1/2014 |
| WO | 2014040993 A1 | 3/2014 |
| WO | 2014048997 A1 | 4/2014 |

* cited by examiner

OPTOELECTRONIC SEMICONDUCTOR COMPONENT

SUMMARY

The present application relates to an optoelectronic semiconductor component.

The document DE 102009051746 A1 describes an optoelectronic semiconductor component.

One object to be achieved consists in specifying a compact, volume emitting and white converting optoelectronic semiconductor component.

An optoelectronic semiconductor component is specified. The optoelectronic semiconductor component can be for example a light emitting diode or a laser diode.

In accordance with at least one embodiment of the optoelectronic semiconductor component, the latter comprises an optoelectronic semiconductor chip provided for emitting electromagnetic radiation. The optoelectronic semiconductor chip can be for example a light emitting diode chip or a laser diode chip.

The optoelectronic semiconductor chip comprises a growth substrate having a growth surface, and a layer sequence grown on the growth surface. By way of example, the layer sequence can be grown epitaxially on the growth substrate. In this case, the epitaxial growth can be carried out in particular on the growth surface. The layer sequence comprises a semiconductor layer sequence comprising an active zone for generating electromagnetic radiation.

The growth substrate has a main extension plane in which it extends in lateral directions. This means that the growth substrate has a thickness perpendicular to the main extension plane, in the vertical direction. The thickness of the growth substrate is small relative to the maximum lateral extension of the growth substrate. Here and hereinafter, a layer can be distinguished in particular by the fact that the layer likewise has a main extension plane which can run substantially parallel to the main extension plane of the growth substrate within the scope of the production tolerances.

In accordance with at least one embodiment of the optoelectronic semiconductor component, the optoelectronic semiconductor chip comprises contact points for electrically contacting the optoelectronic semiconductor chip. The contact points can be applied metallizations, for example, which can be formed with titanium, gold, silver or platinum, for example.

In accordance with at least one embodiment of the optoelectronic semiconductor component, the optoelectronic semiconductor chip comprises an insulation layer embodied in an electrically insulating fashion. The insulation layer can for example contain silicon dioxide or silicon nitride or consist of one of these materials.

In accordance with at least one embodiment of the optoelectronic semiconductor component, the latter comprises a connection carrier fitted to the top surface of the optoelectronic semiconductor chip facing away from the growth surface of the growth substrate. The connection carrier can comprise a connection region having a main body. The main body can be formed from an electrically conductive material. By way of example, the main body is formed with silicon. Alternatively, it is possible for the main body to be embodied in an electrically insulating fashion. The main body can then be formed with a ceramic material, for example.

Furthermore, the main body can be embodied in a mechanically stabilizing fashion. Here and hereinafter, "mechanically stabilizing" means that the main body is for example stable enough to carry and mechanically support the at least one optoelectronic semiconductor chip and the other components of the connection carrier.

Furthermore, the connection carrier can comprise through connections which penetrate completely through the main body, wherein the through connections are completely enclosed by the main body in lateral directions. The through connections serve for electrically contacting the optoelectronic semiconductor component and are freely accessible from the outside at least in places. For this purpose, regions of the through connections can extend on a top surface of the connection carrier facing away from the optoelectronic semiconductor chip, wherein the top surface of the connection carrier is covered or formed only partially by said regions of the through connections. The regions of the through connections which extend on the top surface can be mounting pads and/or connection locations, for example. The connection locations, that is to say the regions of the through connections, can sometimes be formed from a different material than the rest of the through connections. The connection locations can be solderable connection locations. In particular, the distance between the regions of the through connections which extend on the top surface of the connection carrier can be chosen such that the optoelectronic semiconductor component can be applied to a printed circuit board, for example, by means of surface mounting (SMT).

In the case of an optoelectronic semiconductor component described here, the growth substrate is the substrate used for producing the semiconductor layer sequence. In the context of the production of the optoelectronic semiconductor component, therefore, firstly the semiconductor layer sequence can be grown on the growth substrate. In a subsequent method step, the connection carrier is fitted to a side of the semiconductor layer sequence facing away from the growth substrate.

In accordance with at least one embodiment of the optoelectronic semiconductor component, the semiconductor layer sequence is electrically conductively connected to the connection carrier. For this purpose, the insulation layer of the optoelectronic semiconductor chip can be interrupted in places and an electrically conductive layer, for example a second metallization layer, can penetrate through the insulation layer at these locations. This means, in particular, that all outer surfaces of the insulation layer facing away from the growth substrate can be embodied in a multiply connected fashion. At least one of the contact points of the optoelectronic semiconductor chip can then be arranged between the locations at which the electrically conductive layer penetrates through the insulation layer and the semiconductor layer sequence and can be electrically connected to at least one semiconductor layer of the semiconductor layer sequence. By way of example, the optoelectronic semiconductor chip can have a concentrically shaped connection geometry for this purpose. Furthermore, at least one of the contact points can be electrically connected to at least one through connection of the connection carrier.

In accordance with at least one embodiment of the optoelectronic semiconductor component, the connection carrier comprises at least one electronic component. In particular, the main body of the connection carrier can contain the electronic component. By way of example, the electronic component can be an ESD protective diode which can be used to prevent the optoelectronic semiconductor chip from being destroyed by an electrostatic discharge, for example. However, alternatively or additionally it is also possible for the electronic component to be a transistor, a capacitor or a combination of such electronic components. In this case, it is also possible, in particular, for the main body itself to be an integrated circuit for driving and/or for protecting the at least one optoelectronic semiconductor chip. This enables an integration of electrical functions into the connection carrier and a particularly compact design of the optoelectronic semiconductor component.

The main body can comprise at least one p-doped region and at least one n-doped region. The electrical contacting of the electronic component can be effected for example by means of one of the through connections of the main body.

In accordance with at least one embodiment of the optoelectronic semiconductor component, a conversion layer for wavelength conversion is applied on the bottom surface and the side surfaces of the growth substrate. Furthermore, the conversion layer in places can be in direct contact with the connection carrier and/or the growth substrate and/or the insulation layer. Preferably, the conversion layer is embodied in an integral fashion and completely covers the top surface and all side surfaces of the growth substrate and also the side surfaces of the insulation layer that are spaced apart laterally with respect to the layer sequence of the optoelectronic semiconductor chip. Furthermore, the conversion layer can completely cover the side surfaces of the optoelectronic semiconductor chip that are spaced apart laterally with respect to the layer sequence. Furthermore, the conversion layer can cover the connection carrier at least in places. The conversion layer can therefore extend along the side surfaces of the growth substrate and the side surfaces of the optoelectronic semiconductor chip, in particular of the insulation layer, that are spaced apart laterally with respect to the layer sequence as far as the connection carrier. In this case, the conversion layer can enclose the optoelectronic semiconductor chip in a framelike fashion.

Furthermore, the conversion layer, at least in the region of the growth substrate, preferably has a uniform thickness within the scope of the production tolerances and can cover the edges of the growth substrate, that is to say the locations at which the bottom surface and at least one side surface of the growth substrate adjoin one another. In this case, "within the scope of the production tolerances" means that both the tolerances during the production of the conversion layer and the tolerances during the production of the growth substrate, in particular of the side surfaces, should be taken into account. The thickness of the conversion layer fluctuates around a mean value of the thickness for example by at most +/−5%, in particular by at most +/−2%.

The conversion layer can be formed for example with a matrix material such as silicone which contains phosphor particles. Furthermore, the conversion layer can also consist of a, for example ceramic, phosphor. The conversion layer converts the electromagnetic radiation emitted by the semiconductor layer sequence into electromagnetic radiation of lower energy. By way of example, it is possible for the active zone of the semiconductor layer sequence to emit blue light which is converted into red and/or green light and/or yellow light by the conversion layer. The optoelectronic semiconductor component then emits for example white and/or yellow-white mixed light.

The growth substrate itself can be free of phosphor particles. It is therefore possible for the growth substrate to have no wavelength-converting properties.

Furthermore, the outer surfaces of the conversion layer that adjoin air can be provided, at least in places, with cutouts or roughenings which improve the coupling out of the light which is emitted by the semiconductor layer sequences and which subsequently propagates in the growth substrate and the conversion layer at the interfaces with the material surrounding the optoelectronic semiconductor component and/or with the surrounding air. Furthermore, the outer surfaces of the growth substrate that adjoin air can be provided with cutouts or roughenings at least in places. The cutouts or roughenings can form a regular or irregular structuring of the free outer surface of the growth substrate which reduce the probability of reflection or total internal reflection at the interfaces with the material surrounding the optoelectronic semiconductor component and/or with the surrounding air.

In accordance with at least one embodiment of the optoelectronic semiconductor component, the latter comprises an optoelectronic semiconductor chip, comprising a growth substrate having a growth surface, a layer sequence grown on the growth surface and comprising a semiconductor layer sequence comprising an active zone, contact points for electrically contacting the semiconductor layer sequence, and an insulation layer embodied in an electrically insulating fashion, and a connection carrier fitted to the top surface of the optoelectronic semiconductor chip facing away from the growth surface, wherein the semiconductor layer sequence is electrically conductively connected to the connection carrier, the connection carrier comprises at least one electronic component, and a conversion layer is applied on a bottom surface of the growth substrate facing away from the growth surface and on all side surfaces of the growth substrate.

The concept pursued in the case of the optoelectronic semiconductor component described here is, in particular, that of providing a compact optoelectronic semiconductor component in a so-called flip-chip embodiment, that is to say an embodiment in which the emission of radiation is preferably effected in the direction of the growth substrate, wherein a protective diode and/or some other electronic component are/is integrated into the connection carrier as early as in the production process. By virtue of the growth substrate remaining at the layer sequence, this sometimes makes it possible that the optoelectronic properties of the optoelectronic semiconductor chip are not altered during transfer to the connection carrier and it is thus possible to preselect the optoelectronic semiconductor chip according to the optoelectronic properties thereof. The optoelectronic semiconductor component is then present in particular as a volume emitter, that is to say that at least 30% of the electromagnetic radiation emitted by the semiconductor layer sequence emerges through the side surfaces of the growth substrate. The through connections situated at the main body of the connection carrier allow simple population of a printed circuit board, for example, with the optoelectronic semiconductor components by means of surface mounting (SMT).

In accordance with at least one embodiment of the optoelectronic semiconductor component, the insulation layer is arranged in places between the connection carrier and the layer sequence of the optoelectronic semiconductor chip. The insulation layer is accordingly arranged at that side of the layer sequence or the semiconductor layer sequence which faces away from the growth substrate, wherein the layer sequence, in particular the semiconductor layer sequence and/or some other layer of the layer sequence, such as a passivation layer, for example, can directly adjoin the insulation layer in places. Furthermore, the insulation layer can be arranged on the side of the connection carrier facing away from the main body of the connection carrier and can directly adjoin the connection carrier there. However, it is also possible for even further layers, such as an electrically conductive second metallization layer, for example, to be arranged between the insulation layer and the connection carrier.

In accordance with at least one embodiment of the optoelectronic semiconductor component, the insulation layer adjoins the growth surface of the growth substrate in places, wherein all side surfaces and a bottom surface of the growth substrate facing away from the growth surface are free of the insulation layer.

In accordance with at least one embodiment of the optoelectronic semiconductor component, at least one side surface of the insulation layer that is spaced apart laterally with respect to the semiconductor layer sequence terminates flush with at least one side surface of the growth substrate within the scope of the production tolerance. It is furthermore possible for all side surfaces of the insulation layer to terminate flush with a respective side surface of the growth substrate.

Here and hereinafter, "within the scope of the production tolerances" means that the above indications concerning the flush termination of the at least one laterally spaced apart side surface of the insulation layer and the at least one side surface of the growth substrate exhibit a certain inaccuracy caused by the respective chosen method for producing the insulation layer.

In accordance with at least one embodiment of the optoelectronic semiconductor component, the insulation layer is embodied in an integral fashion and in a framelike fashion, that is to say in the manner of a frame around the semiconductor layer sequence. In other words, the insulation layer can envelop the semiconductor layer sequence. The insulation layer can completely cover the semiconductor layer sequence in particular at the laterally situated outer surfaces thereof, wherein the insulation layer can be in direct contact with at least one semiconductor layer of the semiconductor layer sequence at least in places, and thus enables an electrical insulation of the semiconductor layer sequence toward the sides. In a plan view from the direction of the growth substrate, for example the semiconductor layer sequence can then be arranged centrally and be laterally completely framed by the insulation layer. As a result of the framelike embodiment, the semiconductor layer sequence can be insulated particularly effectively toward the outside and be protected against a short circuit, for example. This sometimes enables a more compact population of a printed circuit board with a plurality of optoelectronic semiconductor components.

In accordance with at least one embodiment of the optoelectronic semiconductor component, the growth substrate is formed from a radiation-transmissive material. By way of example, the growth substrate can be formed with sapphire, silicon carbide, gallium nitride or generally a radiation-transmissive material which is suitable for the epitaxial growth of the semiconductor layer sequence. Here and hereinafter, radiation-transmissive means that only a small part of the electromagnetic radiation emitted by the active zone is absorbed by the substrate. By way of example, at most 20%, preferably at most 10%, of the electromagnetic radiation emitted by the active zone of the semiconductor layer sequence is absorbed by the growth substrate.

In accordance with at least one embodiment of the optoelectronic semiconductor component, the layer sequence of the optoelectronic semiconductor chip comprises at least one first metallization layer which is arranged on the side of the semiconductor layer sequence facing away from the growth substrate. The first metallization layer is embodied as reflective for the electromagnetic radiation emitted by the active zone of the semiconductor layer sequence. The optoelectronic semiconductor component thus emits the electromagnetic radiation emitted by the semiconductor layer sequence preferably in the direction of the growth substrate. The first metallization layer can furthermore be provided for electrically contacting the semiconductor layer sequence. By way of example, the first metallization layer can be formed with a metal which contains silver or consists of silver, for example.

In accordance with at least one embodiment of the optoelectronic semiconductor component, the connection carrier comprises a mirror layer embodied as reflective for the electromagnetic radiation emitted by the active zone of the semiconductor layer sequence and for the radiation converted by the conversion layer. The mirror layer is arranged laterally with respect to the optoelectronic semiconductor chip in places. The mirror layer, if it is present, can directly adjoin the conversion layer at least in places. Furthermore, the mirror layer can enclose the at least one optoelectronic semiconductor chip in a framelike fashion. By way of example, the mirror layer can directly adjoin the main body of the connection carrier. The mirror layer is provided, in particular, for reducing light losses. In particular, electromagnetic radiation which is emitted by the active zone of the semiconductor layer sequence in the direction of the connection carrier and/or is scattered by phosphor particles and/or other scattering particles contained in the conversion layer and/or the growth substrate can be reflected by the mirror layer back in the direction of the growth substrate and thus in the direction of the preferred emission, whereby the efficiency of the optoelectronic semiconductor component can be improved and light losses are reduced. The mirror layer can be formed for example with a reflective metal such as aluminum or silver.

In accordance with at least one embodiment of the optoelectronic semiconductor component, the optoelectronic semiconductor chip comprises a second metallization layer embodied as reflective for the electromagnetic radiation emitted by the active zone of the semiconductor layer sequence. The second metallization layer can reflect for example that part of the electromagnetic radiation emitted by the active zone of the semiconductor layer sequence which was not reflected by the first metallization layer, as a result of which light losses are reduced.

In accordance with at least one embodiment of the optoelectronic semiconductor component, the lateral extent of the optoelectronic semiconductor component is at most a factor of 1.2, preferably a factor of 1.1, of the lateral extent of the active zone of the optoelectronic semiconductor chip along the same lateral direction. Thus, in the lateral directions, that is to say along the main extension plane, the area of the entire optoelectronic semiconductor component can be greater than the light emitting area of the at least one optoelectronic semiconductor chip, in particular by a maximum of 40%, preferably a maximum of 20%. In other words, the optoelectronic semiconductor component is embodied as a so-called chip scale component.

In accordance with at least one embodiment of the optoelectronic semiconductor component, the connection carrier comprises an insulation bridge formed with an electrically insulating material. The insulation layer is embodied in particular in an integral fashion. In this case, a two-dimensional projection of the insulation bridge onto the main extension plane of the growth substrate can be embodied in a multiply connected fashion. In other words, in a plan view from the direction of the growth substrate, the insulation bridge appears as a multiply connected area, for example as a ring. Furthermore, the insulation bridge can have the shape of a hollow cylinder. The insulation bridge can be enclosed by the second metallization layer, which can be embodied in an integral fashion. Furthermore, the insulation bridge can enclose an n-type metallization provided for the electrical contacting of the first metallization layer and/or of the p-doped region. This arrangement of the insulation bridge between the n-type metallization and the second metallization layer results in a concentric connection geometry.

In accordance with at least one embodiment of the optoelectronic semiconductor component, the side surfaces of the conversion layer that are spaced apart laterally with respect to the optoelectronic semiconductor chip have traces of singulation.

By way of example, the surface structure of the side surfaces is rougher than that of a top surface—facing away from the connection carrier—of the conversion layer, which does not have traces of singulation. By way of example, the singulation was carried out using a saw, a blade and/or a laser separating method. The side surfaces of the conversion layer then have traces of the material removal using the saw, the blade and/or the laser beam. A singulation carried out in a method step is thus demonstrable on the optoelectronic semiconductor component.

In accordance with at least one embodiment of the optoelectronic semiconductor component, the connection carrier projects beyond the conversion layer at the side surfaces thereof. In other words, the side surfaces of the conversion layer do not terminate flush with the connection carrier even within the scope of the production tolerances. In lateral directions the connection carrier can thus have a larger extent than the conversion layer in the same direction. The side surfaces of the connection carrier can thus be free of the conversion layer.

Furthermore, a method for producing an optoelectronic semiconductor component is specified. The optoelectronic semiconductor component is preferably producible by means of one of the methods described here. That is to say that all features disclosed for the optoelectronic semiconductor component are also disclosed for the method, and vice versa.

In accordance with at least one embodiment of the method, firstly a multiplicity of optoelectronic semiconductor chips and a connection carrier assemblage are provided. The connection carrier assemblage contains the electronic and/or mechanical components of a plurality of connection carriers. In a subsequent method step, the optoelectronic semiconductor chips are connected to the connection carrier assemblage, such that the connection carrier assemblage is arranged at the top surface of the optoelectronic semiconductor chips facing away from the growth surface of the growth substrate.

In accordance with at least one embodiment of the method, the connection carrier assemblage comprises a multiplicity of electronic components, wherein at least one electronic component of the connection carrier assemblage is assigned to each optoelectronic semiconductor chip. Preferably, at least one electronic component is assigned to each optoelectronic semiconductor chip uniquely, in particular one-to-one. By way of example, the electronic component can be a protective diode. The assignment of the protective diode to an optoelectronic semiconductor chip makes it possible to ensure that each optoelectronic semiconductor chip is protected against an electrostatic discharge, for example.

In accordance with at least one embodiment of the method, the latter comprises the following steps:

providing a multiplicity of optoelectronic semiconductor chips, providing the connection carrier assemblage, comprising a multiplicity of electronic components, connecting the optoelectronic semiconductor chips to the connection carrier assemblage at the top surface of the optoelectronic semiconductor chips facing away from the growth surface of the growth substrate, wherein at least one electronic component of the connection carrier assemblage is assigned to each optoelectronic semiconductor chip.

In accordance with at least one embodiment of the method, a conversion layer is applied to the multiplicity of optoelectronic semiconductor chips, such that the conversion layer extends completely along the side surfaces of the growth substrate and the side surfaces of the optoelectronic semiconductor chip running transversely or perpendicularly with respect to the growth surface of the growth substrate. In this case, it is possible for material of the conversion layer at least partly to fill interspaces between adjacent optoelectronic semiconductor chips. It is also possible for the conversion layer to fill all interspaces between adjacent optoelectronic semiconductor chips that are situated laterally with respect to the optoelectronic semiconductor chips. After the conversion layer has been applied, the multiplicity of optoelectronic semiconductor chips can thus be connected via the conversion layer. Furthermore, it is possible for the conversion layer to directly adjoin the insulation layer at least in places.

In accordance with at least one embodiment of the method, the side surfaces of the conversion layer are produced by means of singulation. In this case, the singulation is carried out through the material of the conversion layer. The singulation can be carried out for example by means of a sawing method using a saw, a cutting method using a blade and/or a laser separating method. In this case, it is sometimes possible that parts of the conversion layer are removed during the singulation and afterward are no longer present at the optoelectronic semiconductor component. It is furthermore possible that at the locations at which parts of the conversion layer were removed, subsequently a bottom surface of the connection carrier assemblage facing away from the top surface of the connection carrier assemblage and/or of the connection carrier is freely accessible.

In accordance with at least one embodiment of the method, applying the conversion layer is carried out before connecting the optoelectronic semiconductor chip to the connection carrier assemblage. In this case, the multiplicity of optoelectronic semiconductor chips can be applied separately from one another on the connection carrier assemblage and subsequent singulation through the material of the conversion layer is not necessary. In particular, the multiplicity of optoelectronic semiconductor chips in this case may not be connected to one another via the conversion layer.

In accordance with at least one embodiment of the method, the connection carrier assemblage is singulated at all side surfaces spaced apart laterally with respect to the at least one electronic component. In this case, the singulation of the connection carrier assemblage is not carried out in the same method step as the singulation of the conversion layer. However, it is possible for the singulation of the connection carrier assemblage to be carried out by means of the same singulation process as the singulation of the conversion layer. In particular, the singulation of the connection carrier assemblage can be carried out after the singulation of the conversion layer. After singulation, the connection carrier assemblage is divided into a multiplicity of connection carriers.

The separate singulation of the conversion layer and of the connection carrier assemblage makes it possible sometimes for the respective singulation process used to be adapted in a targeted manner to the material to be singulated. By way of example, the optoelectronic semiconductor component can be made smaller in lateral directions as a result. This enables for example the embodiment of the optoelectronic semiconductor component as a so-called chip scale component. The separate singulation is demonstrable on the finished semiconductor component. In this regard, for example, the main body of the connection carrier can project beyond the conversion layer at the side surfaces thereof on account of the separate singulation.

The optoelectronic semiconductor component described here and the method described here are explained in greater detail below on the basis of exemplary embodiments and the associated figures.

DETAILED DESCRIPTION

Figure 1:
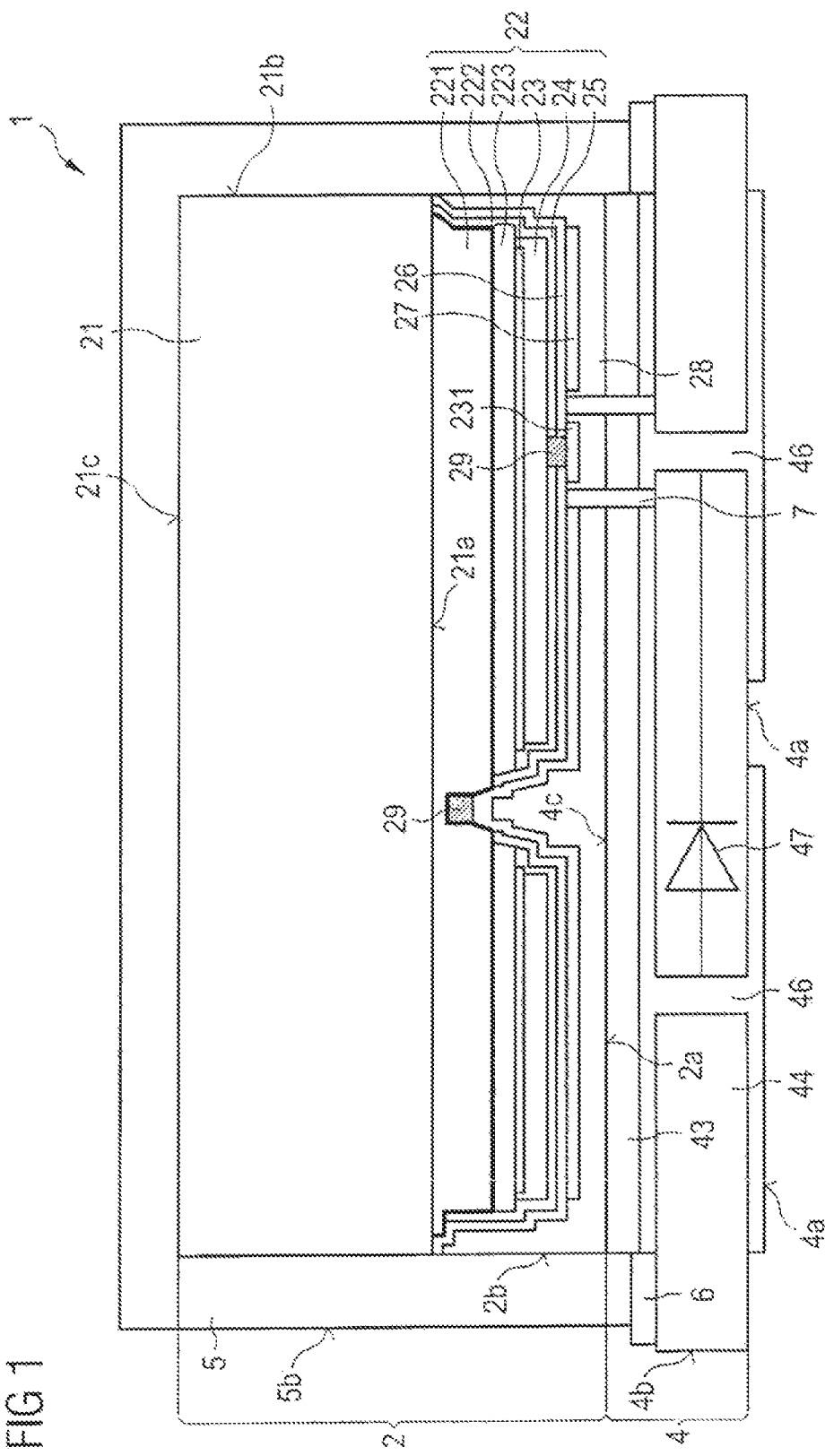
FIG. 1 shows a schematic sectional illustration of one exemplary embodiment of an optoelectronic semiconductor component.
Figure 2:
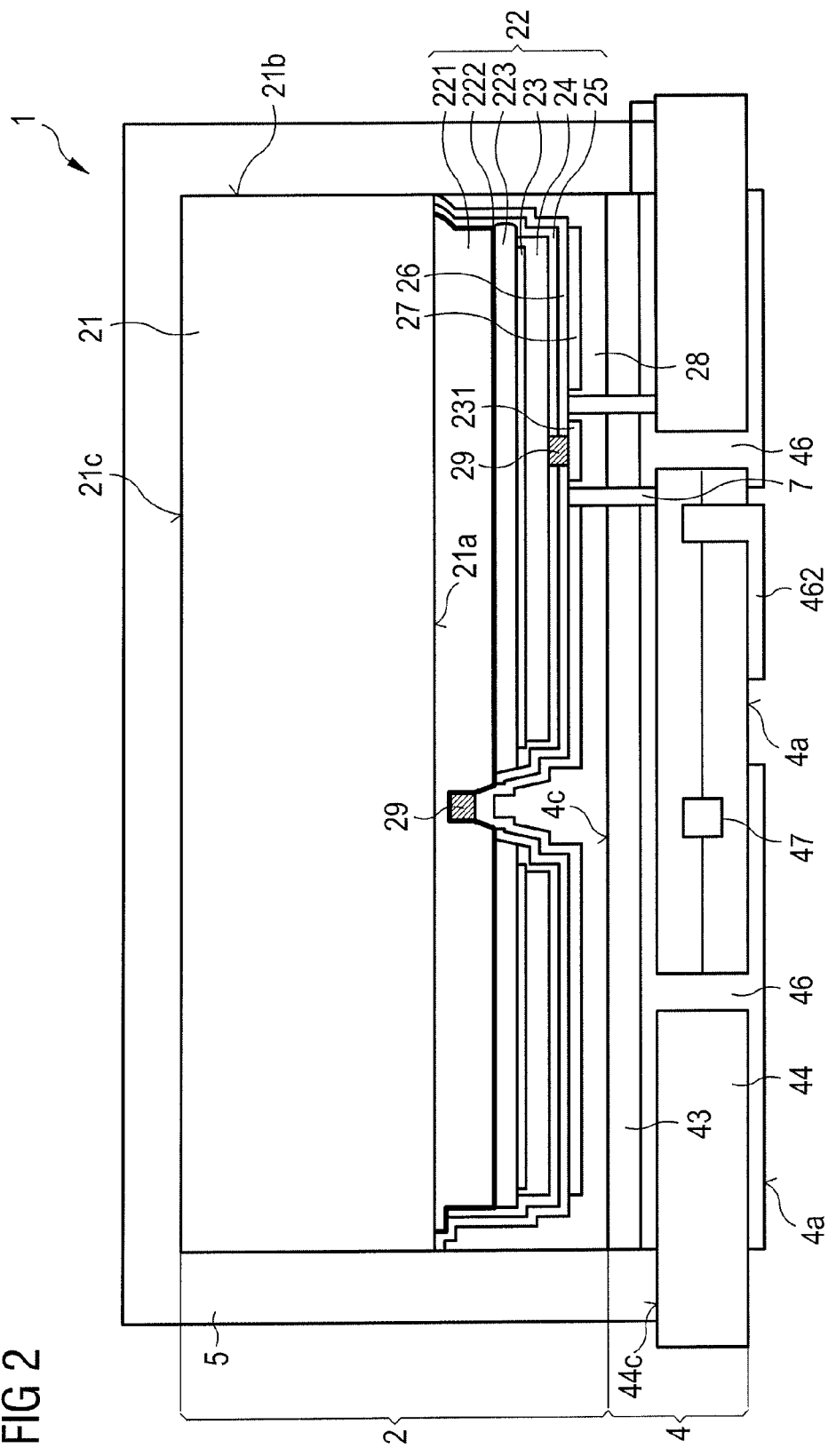
FIG. 2 shows a schematic sectional illustration of a second exemplary embodiment of an optoelectronic semiconductor component.
Figure 3:
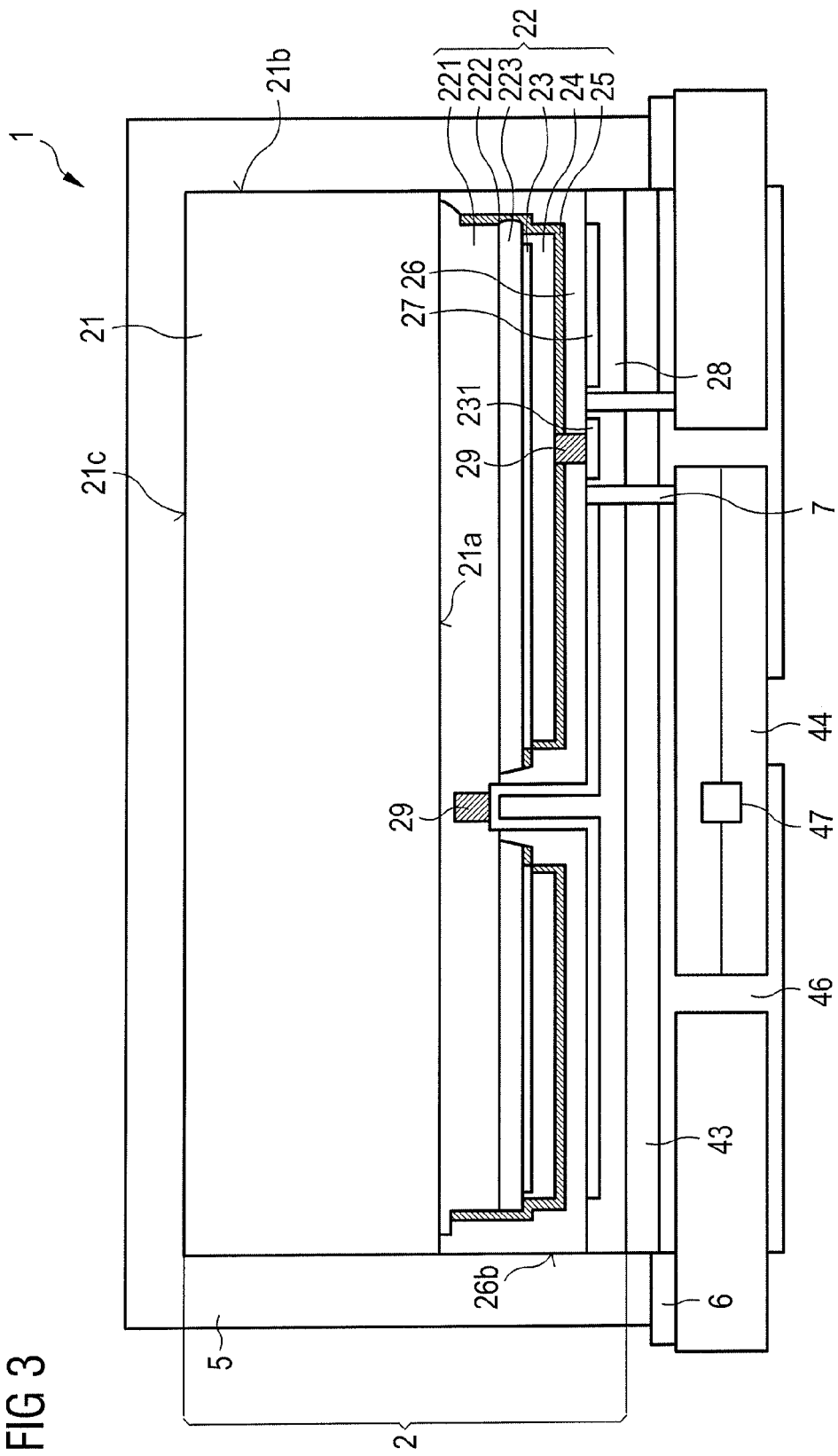
FIG. 3 shows a schematic sectional illustration of a third exemplary embodiment of an optoelectronic semiconductor component.

With reference to the schematic sectional illustrations in FIGS. 1 to 3, exemplary embodiments of an optoelectronic semiconductor component described here are explained in greater detail.

Elements that are identical, of identical type or act identically are provided with the same reference signs in the figure. The figure and the size relationships of the elements illustrated in the figure among one another should not be regarded as to scale. Rather, individual elements may be illustrated with an exaggerated size in order to enable better illustration and/or in order to afford a better understanding.

FIG. 1 shows a schematic sectional illustration of one exemplary embodiment of an optoelectronic semiconductor component 1 described here.

The optoelectronic semiconductor component 1 comprises an optoelectronic semiconductor chip 2. The optoelectronic semiconductor chip 2 comprises a growth substrate 21, having a growth surface 21a, side surfaces 21b and a bottom surface 21c facing away from the growth surface 21a, and also a layer sequence 22 grown on the growth surface 21a. The layer sequence 22 comprises a semiconductor layer sequence 221, 222, 223 comprising an n-doped region 221, which is in direct contact with the growth surface 21a of the growth substrate 21, an active zone 222 and a p-doped region 223.

The growth substrate 21 can furthermore comprise a buffer layer, wherein a top surface of the buffer layer facing away from the bottom surface 21c forms the growth surface 21a of the growth substrate 21. In the case where the growth substrate 21 comprises a buffer layer, the semiconductor layer sequence 221, 222, 223 directly adjoins the buffer layer. Furthermore, it is possible for the semiconductor layer sequence, at its side facing the growth substrate 21, to comprise the buffer layer or to comprise a further buffer layer. Generally it is possible for the semiconductor layer sequence to comprise further layers (not shown).

Furthermore, the layer sequence 22 comprises a first metallization layer 23, an encapsulation layer 24 and a passivation layer 25. The first metallization layer 23 is embodied as reflective for the electromagnetic radiation emitted by the active zone 222. By way of example, the first metallization layer 23 can contain silver or some other metal embodied as reflective for the electromagnetic radiation emitted by the active zone 222. The encapsulation layer 24 is fitted on the side of the first metallization layer 23 facing away from the growth substrate 21 and molds over the first metallization layer 23. The encapsulation layer 24 can contain platinum, gold or titanium, for example. The passivation layer is formed with an insulating material, such as silicon dioxide or silicon nitride, for example, and molds around the encapsulation layer 24 completely and the semiconductor layer sequence 221, 222, 223 at least in places.

The encapsulation layer 24 decouples the first metallization layer 23 from the surroundings and prevents for example the penetration of air or moisture into the first metallization layer 23. Furthermore, the encapsulation layer can suppress a migration of material from the first metallization layer 23. The encapsulation layer 24 can almost completely cover the first metallization layer 23 at its top surface facing away from the semiconductor layer sequence 22. By way of example, more than 90%, preferably more than 95%, of the top surface of the first metallization layer 23 facing away from the semiconductor layer sequence 22 can be covered by the encapsulation layer 24, while the remaining 10%, preferably 5%, directly adjoins the passivation layer 25.

Furthermore, the optoelectronic semiconductor chip 2 comprises an insulation layer 26 and a connection carrier 4, having a top surface 4a and a bottom surface 4c. The insulation layer 26 is arranged in places between the connection carrier 4 and the layer sequence 22. In this case, the insulation layer 26 is in direct contact with the semiconductor layer sequence 22 at least in places. The insulation layer 26 can sometimes enclose the semiconductor layer sequence 221, 222, 223 in a framelike fashion. The insulation layer 26 additionally adjoins the passivation layer 25 of the optoelectronic semiconductor chip 2.

Furthermore, the insulation layer 26 adjoins the growth surface 21a of the growth substrate 21 in places. In this case, all side surfaces 21b and the bottom surface 21c of the growth substrate 21 remain free of the insulation layer 26. The optoelectronic semiconductor chip 2 additionally comprises contact points 29, a second metallization layer 27, an n-type metallization 231 and a contact layer 28. The contact points are electrically conductively connected to the semiconductor layer sequence 221, 222, 223 of the optoelectronic semiconductor chip 2. For this purpose, the insulation layer 26 is interrupted in places and the second metallization layer 27 penetrates through the insulation layer 26 at these locations. The second metallization layer 27 can be embodied such that it is electrically conductive in order to enable an electrical contacting of the contact points 29. By way of example, the second metallization layer 27 can be formed with titanium, silver or platinum. The contact points 29 can be formed for example with titanium, gold, platinum or some other electrically conductive material. The second metallization layer 27 is adjoined by a contact layer 28, which can be formed with silver and/or gold, for example. The contact layer 28 enables a good electrical and/or mechanical connection of the optoelectronic semiconductor chip 2 to a connection carrier 4.

The optoelectronic semiconductor component 2 furthermore comprises the connection carrier 4. The connection carrier 4 of the optoelectronic semiconductor component 1 comprises a main body 44, a solder layer 43, through connections 46, an electronic component 47 and a mirror layer 6.

The through connections 46 penetrate through the main body 44 of the connection carrier 4 in places. Furthermore, parts of the through connections 46 cover the top surface 4a of the connection carrier 4 at least in places. Said parts of the through connections 46 can be for example connection points and/or mounting pads with which the optoelectronic semiconductor component 1 can be mounted on a printed circuit board, for example. Said parts of the through connections 46 can consist of a different material than the rest of the through connections 46 and/or said parts can be fabricated in a separate production step. The through connections 46 can be electrically conductively connected to the contact points 29. By way of example, the through connections 46 can contain copper.

The connection carrier 4 furthermore comprises a solder layer 43, which enables an electrical connection of the through connections 46 to the contact layer 28, and thus to the contact points 29. The solder layer 43 can be formed with gold or tin, for example. It is furthermore possible—in contrast to what is shown in the figures—for the solder layer 43 to comprise a leveling layer, which can be formed with titanium tungsten nitride, for example. The leveling layer serves as a diffusion barrier, for example.

The solder layer 43 can be interrupted in places. At these locations, for example, an insulation bridge 7 can penetrate through the solder layer 43 and directly adjoin the main body 44. The insulation bridge 7 can be formed with an electrically insulating material. The electrically insulating material can be air, for example. The insulation bridge 7 can accordingly be an air-filled cavity. The insulation bridge 7 encloses the n-type metallization layer 231 at the laterally situated outer surfaces thereof and is enclosed by the second metallization layer 27 at its laterally situated outer surfaces.

The optoelectronic semiconductor component 1 additionally comprises a conversion layer 5, which is applied on the bottom surface 21c and the side surfaces 21b of the growth substrate 21 and the side surfaces 2b of the optoelectronic semiconductor chip that are spaced apart laterally with respect to the layer sequence 22, and is in direct contact with these surfaces. The conversion layer 5 is additionally preferably in direct contact with the connection carrier 4 at least in places. By way of example, the conversion layer 5 can be applied to the freely accessible outer surfaces of the optoelectronic semiconductor chip 2 and/or of the connection carrier 4 in a production method by means of spray coating, reshaping, electrophoresis or printing. The conversion layer 5 is preferably produced by a method which can be employed in the wafer assemblage and is thus cost-effective.

However, it is also possible—in contrast to what is shown in FIG. 1—for the outer surfaces 21b, 21c of the growth substrate 1 not to directly adjoin the conversion layer 5. By way of example, the optoelectronic semiconductor component 1 can be potted in a radiation-transmissive potting body and the conversion layer 5 can be applied on the potting body in a manner spaced apart from the optoelectronic semiconductor component 1. In this case, it is possible that firstly the potting body is molded around the optoelectronic semiconductor component 1 and afterward the conversion layer 5 is applied to the potting body in a manner spaced apart from the component parts of the optoelectronic semiconductor component 1.

In addition, it is possible that the conversion layer 5 was applied to the optoelectronic semiconductor chip 2 before the optoelectronic semiconductor chip 2 was applied to the connection carrier 4. In this case, it is possible that although the conversion layer 5 is in direct contact with the outer surfaces of the optoelectronic semiconductor chip 2, the conversion layer does not adjoin the connection carrier 4. By way of example, in this case the conversion layer 5 extends almost completely along the side surfaces 21b of the growth substrate 21 and the side surfaces 2b of the optoelectronic semiconductor chip 2 that run transversely or perpendicularly with respect to the growth surface 21a of the growth substrate 21, wherein a spacing remains between the conversion layer 5 and the connection carrier 4. "Almost completely" means that, for example, at most 20%, preferably at most 10%, of the outer surfaces of the optoelectronic semiconductor chip 2 remains free of the conversion layer 5.

The connection carrier 4 projects beyond the conversion layer 5 at the side surfaces 5b thereof, that is to say that the side surfaces 5b of the conversion layer 5 do not terminate flush with the side surfaces 4b of the connection carrier 4. The side surfaces 4b of the connection carrier 4 are thus free of the conversion layer 5.

Furthermore, the side surfaces 5b of the conversion layer 5 can have traces of singulation.

The connection carrier 4 furthermore comprises—optionally—a mirror layer 6, which is embodied as reflective for the electromagnetic radiation emitted by the active zone 222 of the semiconductor layer sequence 221, 222, 223 and the electromagnetic radiation converted by the conversion layer 5. The mirror layer 6 is arranged on the main body 44 of the connection carrier 4. Furthermore, the mirror layer 6 is arranged laterally with respect to the optoelectronic semiconductor chip 2 at least in places and directly adjoins the conversion layer 5 at least in places. The mirror layer 6 can enclose the optoelectronic semiconductor chip 2 in a frame-like fashion, for example. Electromagnetic radiation which is emitted by the active zone 222 in the direction of the connection carrier 4 or is scattered in the direction of the connection carrier 4 by the scattering particles contained in the conversion element 5 is reflected back again by the mirror layer 6 in the preferred emission direction, that is to say in the direction of the growth substrate 21.

Furthermore, the connection carrier 4 comprises an electronic component 47. The electronic component 47 is arranged between at least two through connections 46 of the connection carrier 4. In the exemplary embodiment shown in FIG. 1, the electronic component 47 is an ESD protective diode which can prevent the optoelectronic semiconductor chip from being destroyed by an electrostatic discharge, for example. The contacting of the electronic component 47 can be effected via at least one of the through connections 46, for example. In the exemplary embodiment shown in FIG. 1, the through connections 46 also function as contactings for the optoelectronic semiconductor chip 2. This allows a smaller number of through connections 46 and thus also a facilitated mounting and/or electrical contacting. The electronic component 47 can be produced for example by corresponding doping of the main body 44. The doping of the main body 44 can be carried out before or after the semiconductor chip 2 is applied to the connection carrier 4.

FIG. 2 shows a schematic sectional illustration of a second exemplary embodiment of an optoelectronic semiconductor component 1 described here.

In the exemplary embodiment of an optoelectronic semiconductor component 1 described here that is shown in FIG. 2, the conversion element 5 directly adjoins a bottom surface 44c of the main body 44 of the connection carrier 4 facing the optoelectronic semiconductor chip 2. In this exemplary embodiment, therefore, no mirror layer 6 is arranged between the main body 44 and the conversion element 5.

In contrast to the exemplary embodiment in FIG. 1, the connection carrier 4 moreover comprises an additional connection location 462, with which the electronic component can be contacted independently of the optoelectronic semiconductor chip 2. This configuration enables for example an electronic functional test of the electronic component 47 independently of an optoelectronic semiconductor chip 2 that has already been applied to the connection carrier 4. The electronic component 47 illustrated in FIG. 2 can be an arbitrary electronic component such as, for example, a transistor, a resistor and/or an ESD protective diode.

FIG. 3 shows a schematic sectional illustration of a third exemplary embodiment of an optoelectronic semiconductor component 1 described here.

In the exemplary embodiment of an optoelectronic semiconductor component 1 illustrated in FIG. 3, at least one laterally spaced apart side surface 26b of the insulation layer 26 terminates flush with at least one side surface 21b of the growth substrate 21 within the scope of the production tolerances. In particular, as a result it may be possible for the conversion layer 5 to have a uniform thickness both in the region of the growth substrate 21 and in the region of the insulation layer 26.

The optoelectronic semiconductor component 1 described here can be embodied particularly compactly and in particular as a chip scale component on account of the integrated component parts, such as the conversion layer 5 and the electronic component 47. In contrast to the flip-chip embodiments known from the prior art, the growth substrate 21 is not detached in the case of the present optoelectronic semiconductor component 1, but rather remains at the semiconductor layer sequence 22. This sometimes results in a significantly reduced mechanical loading of the semiconductor layers 221, 223 grown on the growth substrate 22. Furthermore, the optoelectronic properties of the optoelectronic semiconductor component 1 are altered to a lesser extent than in the case of an otherwise structurally identical optoelectronic semiconductor component in which the growth substrate 21 was detached. This makes it possible, in particular, to provide a compact optoelectronic semiconductor component 1 having a very narrow distribution of the optoelectronic properties.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The present application claims the priority of the German application DE 10 2014 101 492.8, the disclosure content of which is hereby incorporated by reference.

The invention claimed is:

1. An optoelectronic semiconductor component comprising:
    an optoelectronic semiconductor chip, comprising
        a growth substrate having a growth surface,
        a layer sequence grown on the growth surface and comprising a semiconductor layer sequence comprising an active zone,
        contact points for electrically contacting the semiconductor layer sequence, and
        an insulation layer embodied in an electrically insulating fashion; and
    a connection carrier fitted to the top surface of the optoelectronic semiconductor chip facing away from the growth surface,
    wherein the semiconductor layer sequence is electrically conductively connected to the connection carrier,
    wherein a conversion layer is applied on a bottom surface of the growth substrate facing away from the growth surface and on all side surfaces of the growth substrate,
    wherein the connection carrier comprises a mirror layer embodied as reflective for the electromagnetic radiation emitted by the active zone and the radiation converted by the conversion layer, wherein the mirror layer is arranged laterally with respect to the optoelectronic semiconductor chip at least in places and directly adjoins the conversion layer at least in places, and
    wherein the connection carrier comprises at least one electronic component.

2. The optoelectronic semiconductor component according to claim 1, wherein the insulation layer is arranged in places between the connection carrier and the layer sequence of the optoelectronic semiconductor chip,
    wherein the insulation layer adjoins the growth surface of the growth substrate in places, and
    wherein the side surfaces and the bottom surface of the growth substrate are free of the insulation layer.

3. The optoelectronic semiconductor component according to claim 1, wherein the insulation layer is embodied in an integral fashion, wherein the insulation layer encloses the semiconductor chip in a framelike fashion in lateral directions.

4. The optoelectronic semiconductor component according to claim 1, wherein the growth substrate is formed from a radiation-transmissive material.

5. The optoelectronic semiconductor component according to claim 1, wherein the layer sequence comprises at least one first metallization layer which is arranged on the side of the active zone facing away from the growth substrate and is embodied as reflective for the electromagnetic radiation emitted by the active zone.

6. The optoelectronic semiconductor component according to claim 1, wherein the conversion layer is embodied in an integral fashion and the conversion layer extends completely along the side surfaces of the growth substrate and the side surfaces of the optoelectronic semiconductor chip running transversely or perpendicularly with respect to the growth surface of the growth substrate.

7. The optoelectronic semiconductor component according to claim 6, wherein the conversion layer is in direct contact with the connection carrier at least in places.

8. The optoelectronic semiconductor component according to claim 1, wherein the optoelectronic semiconductor chip comprises a second metallization layer embodied as reflective for the electromagnetic radiation emitted by the active zone.

9. The optoelectronic semiconductor component according to claim 1, wherein the lateral extent of the optoelectronic semiconductor component is at most a factor of 1.2, preferably at most a factor of 1.1, larger than the lateral extent of the active zone of the optoelectronic semiconductor chip along the same lateral direction.

10. The optoelectronic semiconductor component according to claim 1, wherein the connection carrier comprises an insulation bridge formed with an electrically insulating material, wherein the insulation bridge is embodied in an integral fashion and the insulation bridge is embodied in a multiply connected fashion in a plan view of a surface of the insulation bridge facing the growth substrate.

11. The optoelectronic semiconductor component according to claim 1, wherein the semiconductor chip is contacted without bond wires, and wherein the connection carrier of the optoelectronic semiconductor component comprises through connections with solderable connection locations which are provided for the surface mounting of the optoelectronic semiconductor component.

12. The optoelectronic semiconductor component according to claim 1, wherein side surfaces of the conversion layer that are spaced apart laterally with respect to the optoelectronic semiconductor chip have traces of singulation.

13. The optoelectronic semiconductor component according to claim 1, wherein the connection carrier projects beyond the conversion layer at the side surfaces thereof.

14. A method for producing an optoelectronic semiconductor component according to claim 1, comprising the following steps:
 providing a multiplicity of optoelectronic semiconductor chips;
 providing a connection carrier assemblage, comprising a multiplicity of connection carriers, having a multiplicity of electronic components; and
 connecting the optoelectronic semiconductor chips to the connection carrier assemblage at the top surface of the optoelectronic semiconductor chips facing away from the growth surface of the growth substrate,
 wherein at least one electronic component of the connection carrier assemblage is assigned to each optoelectronic semiconductor chip.

15. The method according to claim 14, wherein a conversion layer is applied to the multiplicity of optoelectronic, semiconductor chips, such that it extends completely along the side surfaces of the growth substrate and the side surfaces of the optoelectronic semiconductor chip running transversely or perpendicularly with respect to the growth surface of the growth substrate.

16. The method according to claim 14, wherein side surfaces of the conversion layer are produced by means of singulation through material of the conversion layer.

17. The method according to claim 14, wherein applying the conversion layer is carried out before connecting the optoelectronic semiconductor chip to the connection carrier.

18. The method according to claim 14, wherein the connection carrier assemblage is singulated at all side surfaces spaced apart laterally with respect to the at least one electronic component, wherein the singulation of the main body of the connection carrier assemblage is not carried out in the same method step as the singulation of the conversion layer.

* * * * *